(12) United States Patent
Tsai

(10) Patent No.: US 9,269,732 B2
(45) Date of Patent: Feb. 23, 2016

(54) CHIP PACKAGE

(75) Inventor: Chia-Lun Tsai, Tainan (TW)

(73) Assignee: XINTEC INC., Taoyuan (TW)

( * ) Notice: Subject to any disclaimer, the term of this patent is extended or adjusted under 35 U.S.C. 154(b) by 260 days.

(21) Appl. No.: 12/766,362

(22) Filed: Apr. 23, 2010

(65) Prior Publication Data

US 2011/0156218 A1    Jun. 30, 2011

(30) Foreign Application Priority Data

Dec. 28, 2009 (TW) .............................. 98145253 A

(51) Int. Cl.
*H01L 27/146* (2006.01)
*H01L 23/00* (2006.01)
*H01L 23/10* (2006.01)
*H01L 23/31* (2006.01)

(52) U.S. Cl.
CPC .......... *H01L 27/14618* (2013.01); *H01L 23/10* (2013.01); *H01L 23/562* (2013.01); *H01L 24/03* (2013.01); *H01L 24/05* (2013.01); *H01L 23/3114* (2013.01); *H01L 24/13* (2013.01); *H01L 27/14627* (2013.01); *H01L 2224/023* (2013.01); *H01L 2224/02371* (2013.01); *H01L 2224/02377* (2013.01); *H01L 2224/0345* (2013.01); *H01L 2224/0361* (2013.01); *H01L 2224/0362* (2013.01); *H01L 2224/0391* (2013.01); *H01L 2224/0401* (2013.01); *H01L 2224/05008* (2013.01); *H01L 2224/05089* (2013.01); *H01L 2224/05124* (2013.01); *H01L 2224/05147* (2013.01); *H01L 2224/05548* (2013.01); *H01L 2224/05624* (2013.01); *H01L 2224/05639* (2013.01); *H01L 2224/05647* (2013.01); *H01L 2224/05655* (2013.01); *H01L 2224/1132* (2013.01); *H01L 2224/11462* (2013.01); *H01L 2224/11849* (2013.01); *H01L 2224/131* (2013.01); *H01L 2224/13022* (2013.01); *H01L 2224/13024* (2013.01); *H01L 2924/01029* (2013.01); *H01L 2924/1461* (2013.01)

(58) Field of Classification Search
CPC ................. H01L 2224/48247; H01L 2924/00; H01L 23/52; H01L 27/10; H01L 23/562; H01L 23/3677; H01L 22/32
USPC ............................ 257/620, 48, 678–758, 409
See application file for complete search history.

(56) References Cited

U.S. PATENT DOCUMENTS

| | | | | |
|---|---|---|---|---|
| 5,239,191 A | * | 8/1993 | Sakumoto | H01L 22/32 257/203 |
| 2005/0082577 A1 | * | 4/2005 | Usui | 257/211 |
| 2005/0151239 A1 | * | 7/2005 | Lee | 257/698 |
| 2005/0194649 A1 | * | 9/2005 | Oki | 257/409 |
| 2006/0125090 A1 | * | 6/2006 | Chen | H01L 23/3677 257/712 |
| 2007/0013071 A1 | * | 1/2007 | Adkisson et al. | 257/758 |
| 2007/0069365 A1 | * | 3/2007 | Archer et al. | 257/700 |
| 2008/0099900 A1 | * | 5/2008 | Oganesian et al. | 257/678 |
| 2008/0191205 A1 | * | 8/2008 | Tsai et al. | 257/48 |
| 2009/0315184 A1 | * | 12/2009 | Tokitoh | 257/758 |

\* cited by examiner

*Primary Examiner* — Jerome Jackson, Jr.
*Assistant Examiner* — Fang-Xing Jiang
(74) *Attorney, Agent, or Firm* — Birch, Stewart, Kolasch & Birch, LLP

(57) ABSTRACT

A chip package is provided. The chip package includes a chip, having a plurality of conductive pads disposed along a periphery of the chip, wherein the conductive pads have a width. A seal ring includes a plurality of metal strips disposed within a space between the two adjacent conductive pads. Each metal strip is electrically connected to at most one of the two adjacent conductive pads.

16 Claims, 8 Drawing Sheets

US 9,269,732 B2

CHIP PACKAGE

CROSS REFERENCE TO RELATED APPLICATIONS

This Application claims priority of Taiwan Patent Application No. 98145253, filed on Dec. 28, 2009, the entirety of which is incorporated by reference herein.

BACKGROUND OF THE INVENTION

1. Field of the Invention

The present invention relates to a chip package, and in particular relates to a sealing ring structure of a chip package.

2. Description of the Related Art

Wafer level packaging technology has been developed for packaging chips. After a wafer level package is completed, a cutting process is performed between each chip to separate the chips from each other. In order to reduce the probability of cracks, produced by the cutting process, extending to the inner side portions of the chip, a sealing ring is disposed between each chip to enhance chip package reliability. However, because the sealing ring occupies an extra area of a wafer, the amount of dies formed on the wafer is reduced.

BRIEF SUMMARY OF THE INVENTION

According to an illustrative embodiment, a chip package is provided. The chip package comprises a chip having a plurality of conductive pads disposed along a periphery of the chip. A seal ring containing a plurality of metal strips is disposed within a space between the two adjacent conductive pads, wherein each metal strip is electrically connected to at most one of the two adjacent conductive pads.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
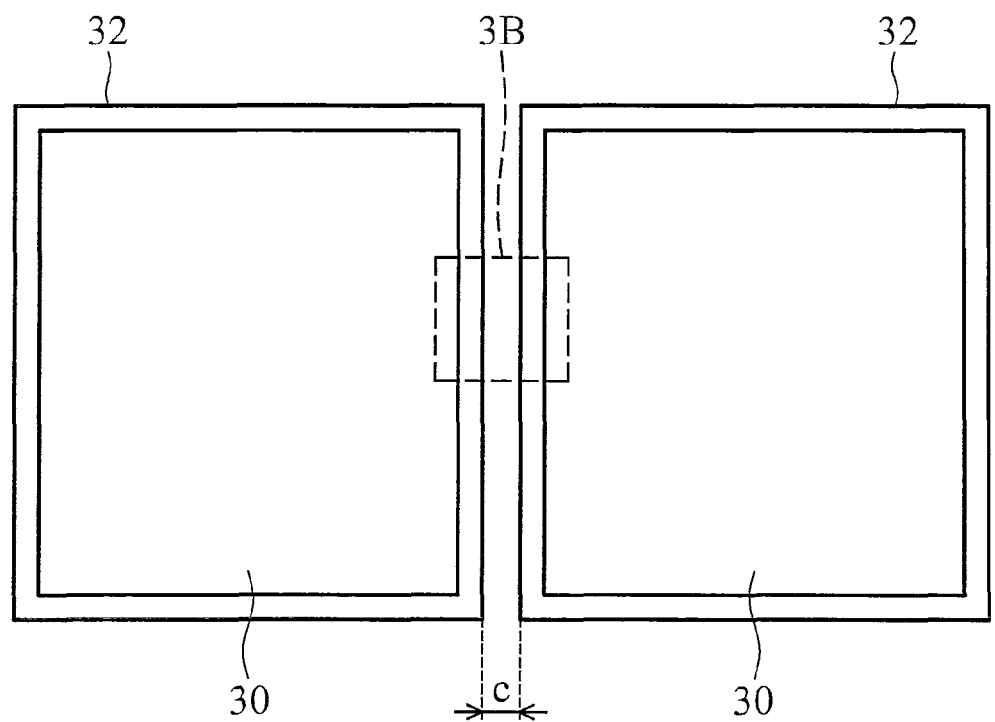
FIG. 1 shows a top view of sealing ring structures of chip packages according to an embodiment of the invention.

The following description is of a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts. In the drawings, the size of some of the elements may be exaggerated and not drawn to scale for illustrative purposes. The dimensions and the relative dimensions do not correspond to actual dimensions to practice of the invention. Further, parts of the elements in the drawings are illustrated by the following description. Some elements not shown in the drawings are known by one skilled the art.

The embodiments of chip packages of the invention and fabrication methods thereof are illustrated by embodiments of fabricating image sensor packages in the following description. However, it should be appreciated that the invention may also be applied to forming other semiconductor chip packages. Therefore, the packages of the embodiments of the invention may be applied to active or passive components, or electronic components with digital or analog circuits, such as optoelectronic devices, micro electro mechanical systems (MEMS), micro fluidic systems, and physical sensors for detecting heat, light, or pressure. Particularly, a wafer level chip scale packaging (WLCSP) process may be applied to package semiconductor chips, such as image sensors, solar cells, RF circuits, accelerators, gyroscopes, micro actuators, surface acoustic wave devices, pressure sensors, and ink printer heads.

The wafer level chip scale packaging process herein mainly means that after the packaging process is accomplished during a wafer stage, a wafer with chips is cut to obtain separate independent packages. However, in an embodiment of the invention, separate independent chips may be redistributed overlying a supporting wafer and then be packaged, which may also be referred to as a wafer level chip scale packaging process. In addition, the wafer level chip scale packaging process may also be adapted to form chip packages of multi-layered integrated circuit devices by stacking a plurality of wafers having integrated circuits together.

Figure 2A:
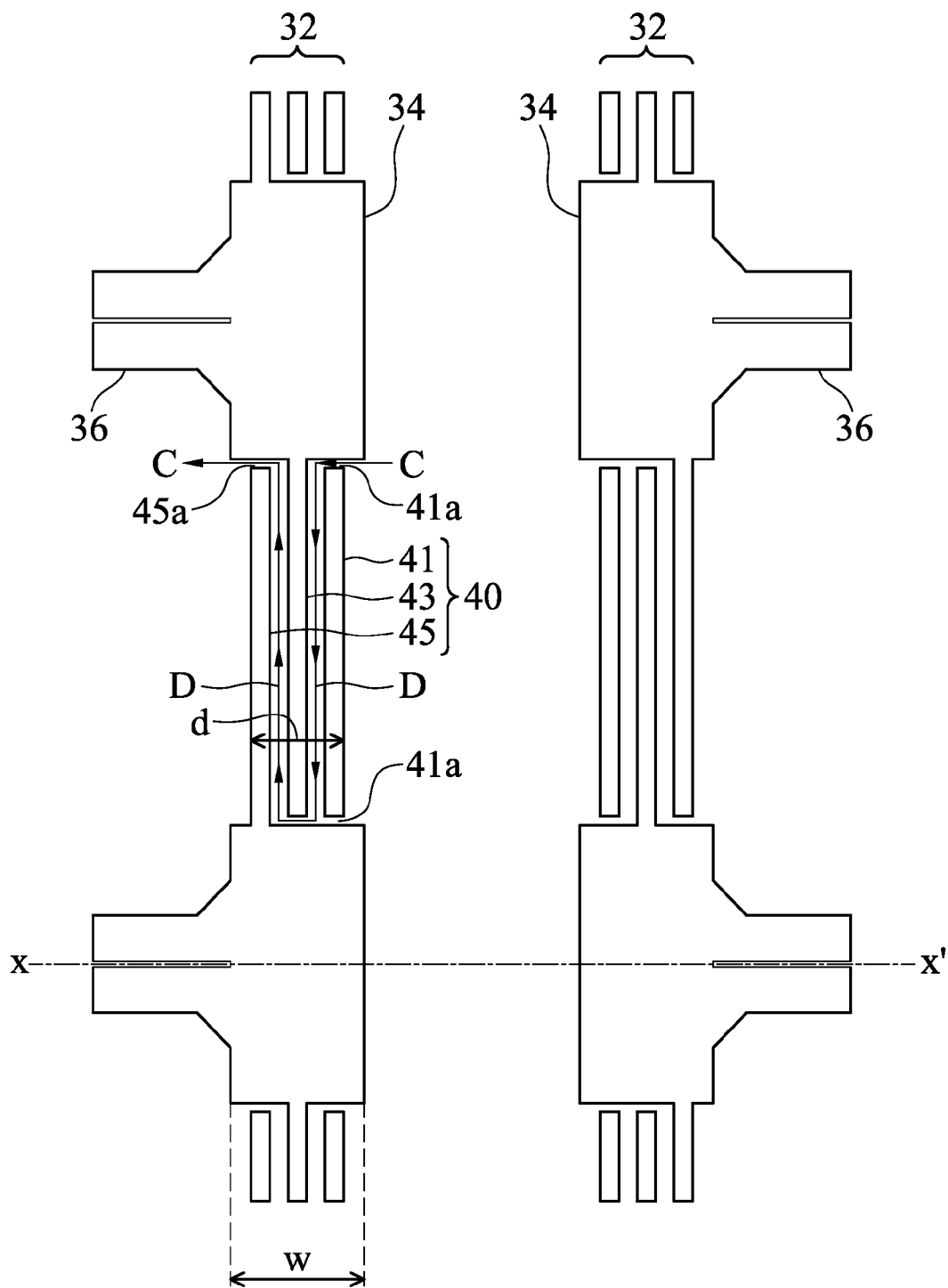
FIG. 2A shows an enlarged top view of the dotted line area 3B of FIG. 1.

Referring to FIG. 1, a top view of sealing ring structures of chip packages according to an embodiment of the invention is shown. A periphery of each chip 30 is surrounded by a sealing ring 32 and a scribe line c is disposed between the two adjacent sealing rings 32. Referring to FIG. 2A, an enlarged top view of the dotted line area 3B of FIG. 1 is shown. As shown in FIG. 2A, a plurality of conductive pads 34 is disposed along the periphery of the chip. The sealing ring 32 includes a plurality of metal strips 40 disposed between the two adjacent conductive pads 34. In an embodiment, all of the metal strips 40 are disposed within a space between the two adjacent conductive pads 34. Thus, the sealing ring structure of the embodiment can be accomplished by using the conductive pads 34 and the spaces between the two adjacent conductive pads 34. In another embodiment, if the width of the sealing ring 32 is not greater than the width of the two adjacent conductive pads 34 and the width between the two adjacent sealing rings 32 is about 80 μm, a required width for the scribe line c is only about 80 μm. Accordingly, for a wafer with a diameter of 8 inches, the amount of area available for dies is increased. Moreover, the sealing ring structure design of the embodiment can be applied to a chip on board (COB) packaging process and a chip scale packaging (CSP) process.

In an embodiment, the conductive pad 34 may be an extended contact pad, which is electrically connected to a bonding pad on the chip through a connection part 36 thereof. Thus, a space between the extended contact pad and the bonding pad to dispose an inside sealing ring is not needed, such that the area of chips is decreased.

In an embodiment, the width w of the conductive pad 34 is for example about 50 μm and the width of the metal strip 40 is for example about 10 μm. Thus, as shown in FIG. 2A, three parallel metal strips 41, 43 and 45 can be disposed between the conductive pads 34. Moreover, in an embodiment, more than three or less than three metal strips can be disposed between the conductive pads 34 depending on actual requirements for the chip packages. It is noted that two ends of each metal strip 41, 43 and 45 are not both electrically connected to two adjacent conductive pads 34, i.e. at least one gap is disposed between each metal strip and two adjacent conductive pads to avoid short circuiting. In an embodiment, at least one outside gap is disposed at the outside of the space between the two adjacent conductive pads and at least one inside gap is disposed at the inside of the space between the two adjacent conductive pads. For example, an outside gap 41a is disposed between the metal strip 41 adjacent to the outside of the chip, such as the scribe line c, and the conductive pad 34. Meanwhile, an inside gap 45a is disposed between the metal strip 45 adjacent to the inside of the chip and the conductive pad 34. In an embodiment, a curved channel C-C is formed from the outside gap 41a to the inside gap 45a and between the parallel metal trips 41, 43 and 45, and a length of the curved channel C-C is greater than a distance d between the outside metal strip 41 and the inside metal strip 45. The curved channel C-C comprises a connection channel D along a space between the two metal strips 41 and 43 and another connection channel D along a space between the two metal strips 43 and 45. Accordingly, by forming the metal strips 41, 43 and 45, the stress produced from the cutting process for the chip package is passed along to the curved channel C-C between the metal strips 41, 43 and 45 to enter the chip package. Thus, direct stress passing from the outside gap to the inside gap is prevented, thereby preventing cracks from forming and extending to the inner side of the chip.

Figure 2B:
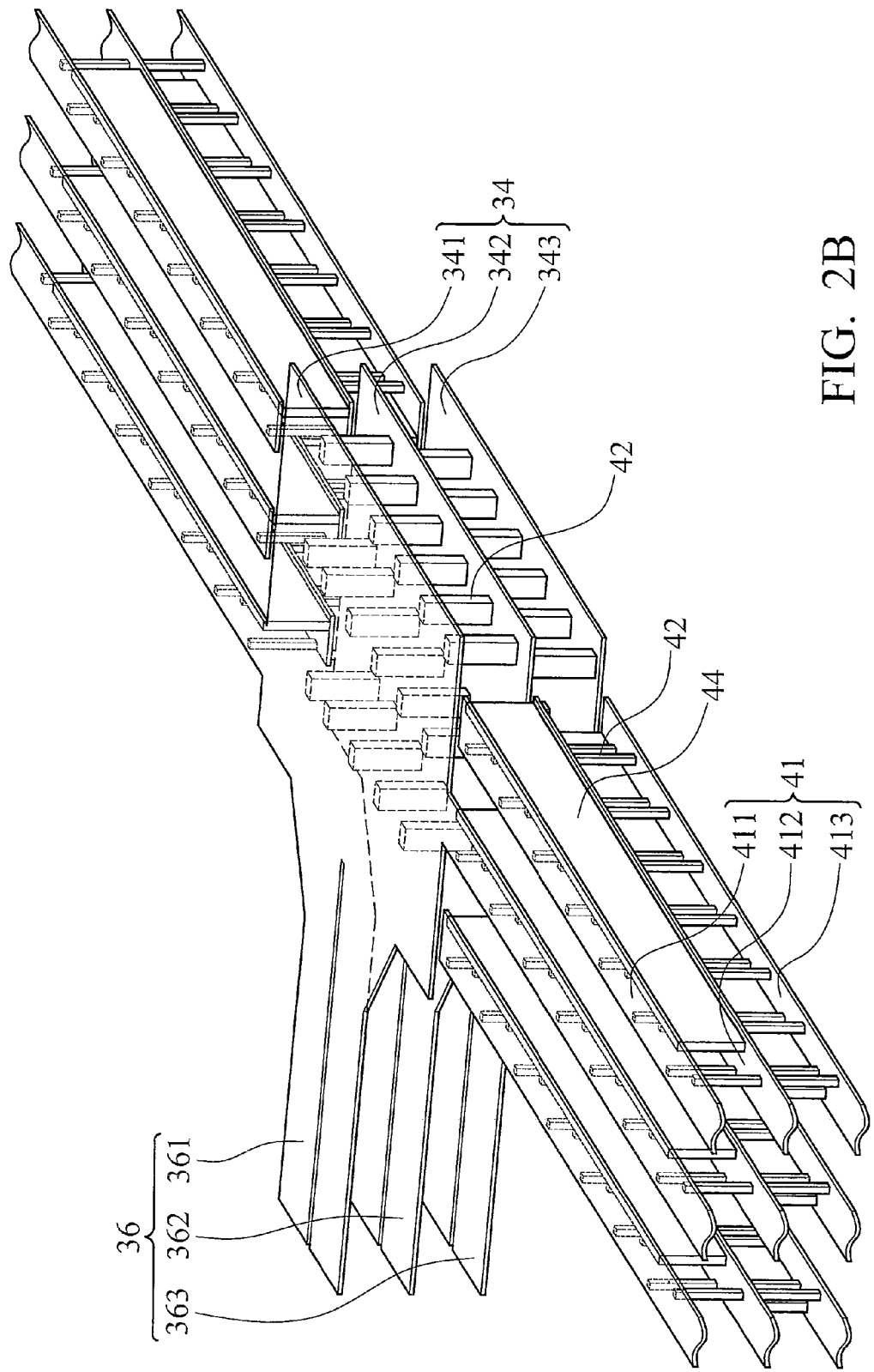
FIG. 2B shows a three-dimensional view of a portion of a sealing ring structure according to an embodiment of the invention.

Next, referring to FIG. 2B, a three-dimensional view of a portion of the sealing ring structure 32 according to an embodiment of the invention is shown. In the embodiment, the conductive pad 34 has three metal layers 341, 342 and 343. The connection part 36, extending from the conductive pad 34 to electrically connect to the bonding pad (mot shown), also has three metal layers 361, 362 and 363. In this embodiment, the conductive pad is electrically connected to the bonding pad through the three metal layers. However, in other embodiments, the conductive pad can be electrically connected to the bonding pad through one metal layer. For example, the conductive pad can be electrically connected to the bonding pad through the middle metal layer 362. In an embodiment, a plurality of vias 42 is disposed between the three metal layers 341, 342 and 343 of the conductive pad 34 for electrically connecting each metal layer. The positions of the vias 42 are not limited. Meanwhile, the vias 42 can prevent some cracks from occurring and extending to the inner side of the chip.

Figure 3A:
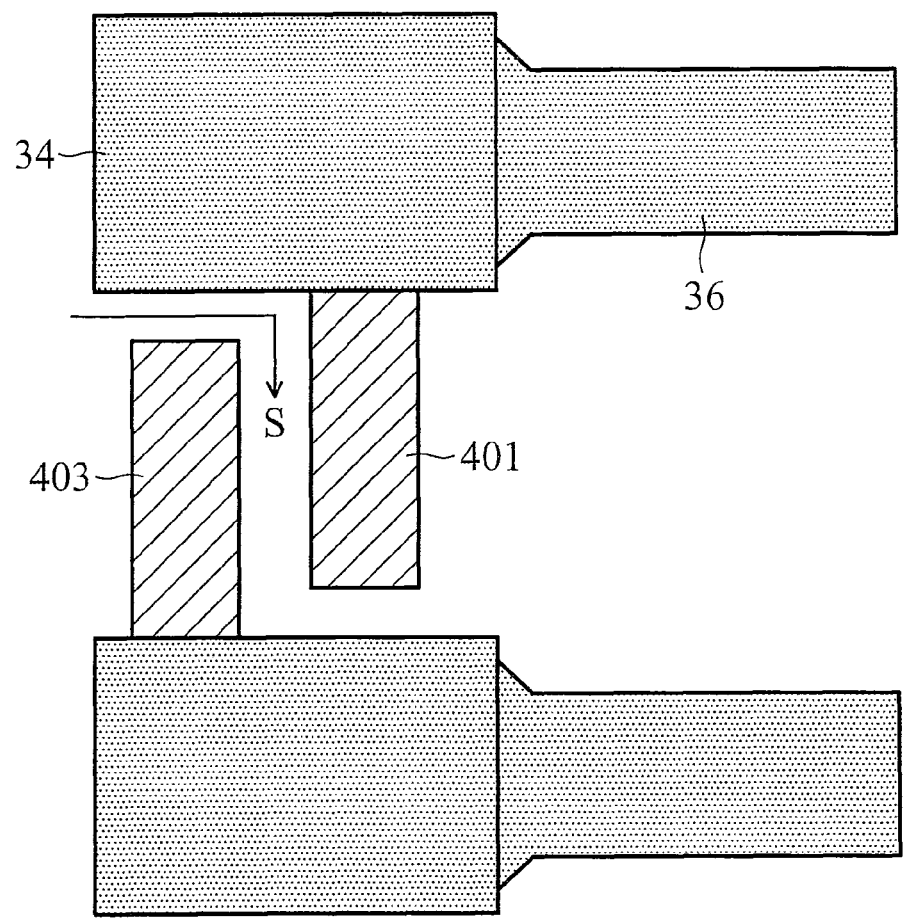
FIG. 3A shows a top view of a portion of a sealing ring structure according to an embodiment of the invention.
Figure 3B:
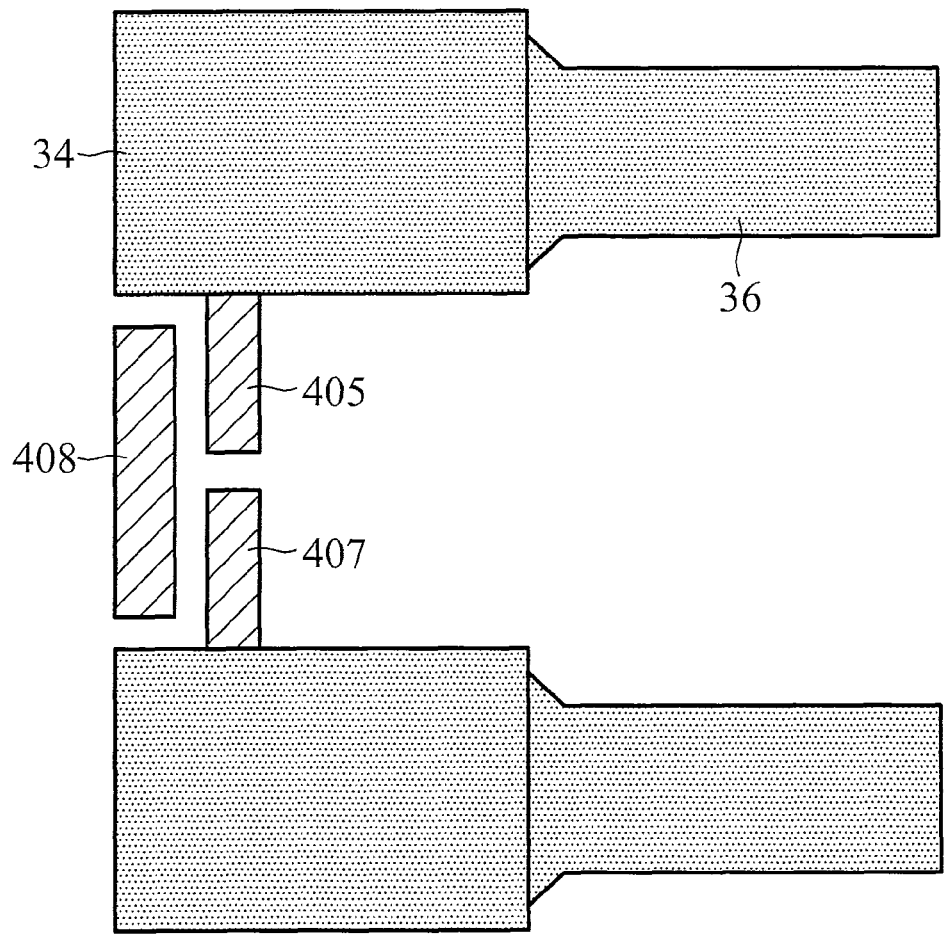
FIG. 3B shows a top view of a portion of a sealing ring structure according to another embodiment of the invention.

In an embodiment, each metal strip 41, 43 and 45 disposed between the two adjacent conductive pads 34 can have three metal layers. As shown in FIG. 2B, the metal strip 41 has three metal layers 411, 412 and 413 and a plurality vias 42 is disposed between each metal layer 411, 412 and 413 for electrically connecting each metal layer. The vias 42 can be disposed at any position between each metal layer, and is not limited to the positions as shown in FIG. 2B. In an embodiment, the metal layers of the conductive pads can be formed with the metal layers of the metal strips at the same time, thus the amount of the metal layers of the conductive pads can be the same as that of the metal layers of the metal strips. It is noted that, in an embodiment, at least a stress barrier 44 is disposed between the metal layers 411, 412 and 413 of the metal strip 41. The stress barrier 44 can strengthen the structure of the sealing ring 32 and further efficiently prevent cracks from occurring and extending to the inner side of the chip. In an embodiment, at least a stress barrier is disposed between the metal layers of each metal strip 41, 43 and 43, i.e. each metal strip 41, 43 and 43 has a stress barrier. As shown in FIG. 2B, gaps between the stress barriers and the conductive pads can be disposed according to the arrangement of the metal strips and the conductive pads as shown in FIG. 2A. Therefore, the stress produced from the cutting process for the chip package is passed along the extended channel between the two stress barriers to enter the chip package. Thus, direct stress passing from the outside gap to the inside gap is prevented, thereby preventing cracks from forming and extending to the inner side of the chip In the embodiment of the sealing ring structure, the metal strips 40 between the conductive pads 34 can be disposed by various types, wherein one type is shown in FIG. 2A. Meanwhile, two other types are shown in FIGS. 3A and 3B. Referring to FIG. 3A, in one embodiment, two parallel metal strips 401 and 403 are disposed between the conductive pads 34. One end of the metal strips 401 and 403 is connected to one of the conductive pads 34 and the other end of the metal strips 401 and 403 is disposed apart from the other conductive pad with a gap. The gaps between the metal strips 401 and 403 and the conductive pads 34 are staggered, such that the stress produced from the cutting process for the chip package is passed along the extended channel S between the two metal strips 401 and 40 to enter the chip package. Thus, preventing cracks from forming and extending to the inner side of the chip.

Next, referring to FIG. 3B, in this embodiment, three metal strips 405, 407 and 409 are disposed between the conductive pads 34, wherein the metal strips 405 and 407 are arranged on the same straight line. The direction of the straight line of the arrangement of the metal strips 405 and 407 is perpendicular to the conductive pad 34. Meanwhile, one end of the metal strips 405 and 407 are connected to the conductive pads 34 and a gap is formed between the metal strips 405 and 407. Another metal strip 408 is parallel to the metal strips 405 and 407 and both of the two ends of the metal strip 408 are disposed apart from the conductive pads 34 with a gap. It is noted that, in FIG. 3B, the gaps between the metal strips and the conductive pads are staggered.

The arrangements of the metal strips for the sealing ring structure of the invention are illustrated by several embodiments in the present specification. However, it should be appreciated that the metal strips between the conductive pads may also be arranged in other arrangements. The requirement for arrangement of the metal strips comprises not producing a short circuit between the conductive pads, and staggering the gaps between the metal strips and two adjacent conductive pads or staggering the gaps between each metal strip arranged.

Figure 4A:
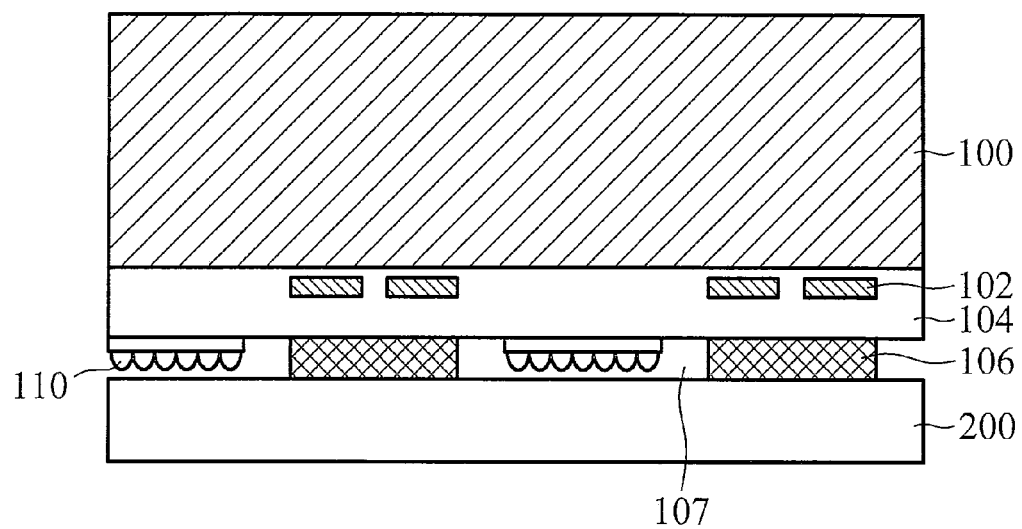
FIGS. 4A-4F are illustrative cross sections showing the steps for fabricating a chip package according to an embodiment of the invention.

Referring to FIGS. 4A-4F, cross sections illustrating the steps for fabricating a chip package according to an embodiment of the invention are shown. The cross sections of FIGS. 4A-4F are taken along the cross section line X-X' of FIG. 2A, which are located at the position of the conductive pads 34, such that the metal strips 40 are not shown in FIGS. 4A-4F. Referring to FIG. 4A, firstly, a substrate 100, for example a semiconductor wafer, is provided. The semiconductor wafer 100 has a plurality of chips (not shown), for example image sensor devices, formed thereon and a corresponding microlens array 100 may be disposed over the image sensor devices to be an image sensing surface. A dielectric layer 104, for example a silicon oxide layer, is disposed on a substrate of the semiconductor wafer and each chip has corresponding conductive pads 102 disposed in the dielectric layer 104.

Next, a front side of the semiconductor wafer 100, i.e. the surface having the chips thereon is bonded to a packaging layer 200. The packaging layer is used for a carrier structure of the chip packages, which may be a transparent substrate made of glass, quartz, opal, plastic or other materials that permit light to pass therethrough. Moreover, a filter and/or an anti-reflective layer can be selectively formed on the packaging layer. In an embodiment, a spacer 106 may be disposed between the packaging layer 200 and the semiconductor wafer 100, such that a cavity 107 is formed between the packaging layer 200 and the semiconductor wafer 100, wherein the cavity 107 is surrounded by the spacer 106.

The spacer 106 may be made of epoxy resin, a solder mask or other suitable insulating materials, for example inorganic materials of silicon oxides, silicon nitrides, silicon oxynitrides, metal oxides or combinations thereof, or organic polymer materials of polyimide (PI), butylcyclobutene (BCB), parylene, polynaphthalenes, fluorocarbons, accrylates, etc. The spacer 106 can be formed by a coating method, such as a spin coating method, a spray coating method, or a curtain coating method, or other suitable deposition methods, such as a liquid phase deposition method, a physical vapor deposition (PVD) method, a chemical vapor deposition (CVD) method, a low pressure chemical vapor deposition (LPCVD) method, a plasma enhanced chemical vapor deposition (PECVD) method, a rapid thermal-CVD (RTCVD) method or an atmospheric pressure chemical vapor deposition (APCVD) method. The spacer 106 can block environmental contaminants or prevent the chip packages from water vapor permeation.

In an embodiment, the chip packages can be applied to, but are not limited to, image sensor devices, such as complementary metal oxide semiconductor (CMOS) devices or charge-couple devices (CCD). Moreover, the conductive pads 102 may be extension pads and preferably, formed from copper (Cu), aluminum (Al) or other suitable metal materials.

Figure 4B:
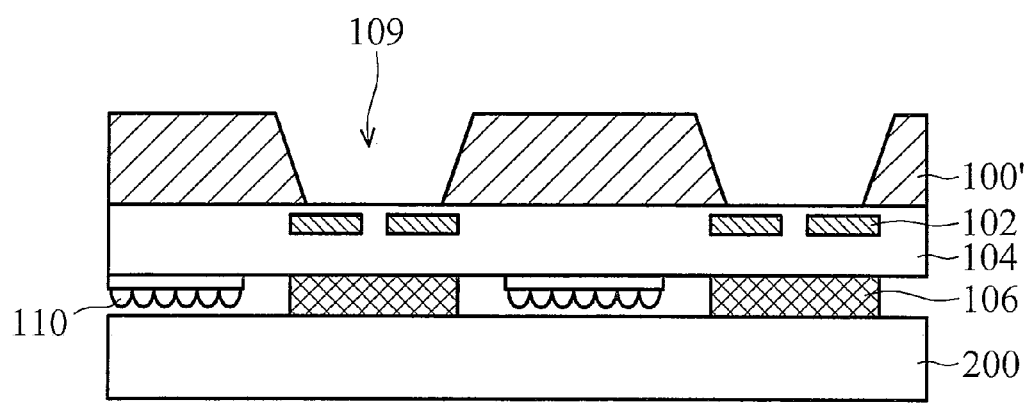

Next, referring to FIG. 4B, the semiconductor wafer 100 is thinned from a back side thereof by a thinning process to form a semiconductor wafer 100' with a predetermined thickness. The thinning process may be an etching process, a milling process, a grinding process or a polishing process. Then, notches 109 are formed on the back side of the thinned semiconductor wafer 100' by a notching process. After forming the notches 109, the semiconductor wafer 100' is divided to form a plurality of independent chips.

Figure 4C:
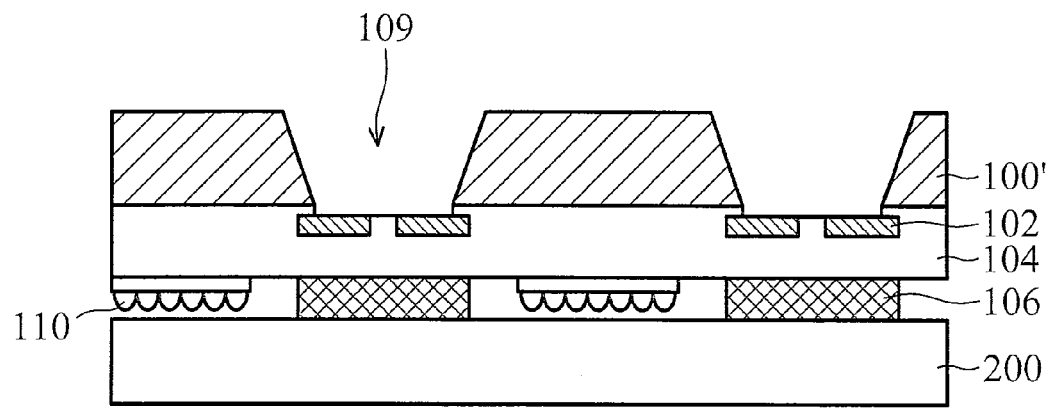
Figure 4D:
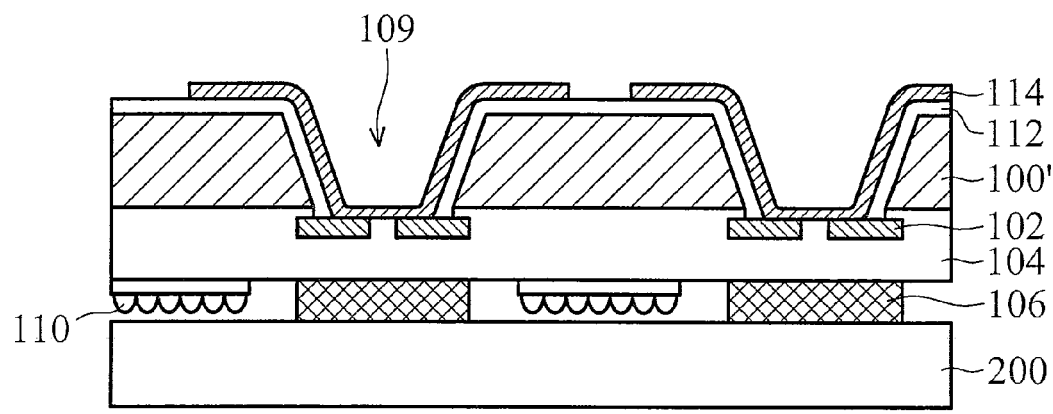

Referring to FIG. 4C, the dielectric layer 104 under the bottoms of the notches 109 is etched to expose a contact surface of the conductive pads 102. Then, referring to FIG. 4D, an insulating layer 112 is formed to cover the sidewalls of the notches 109 and the back side of the semiconductor wafer 100'. In an embodiment, the insulating layer 112 may be formed from epoxy resin, a solder mask or other suitable insulating materials, for example inorganic materials of silicon oxides, silicon nitrides, silicon oxynitrides, metal oxides or combinations thereof, or organic polymer materials of polyimide (PI), butylcyclobutene (BCB), parylene, polynaphthalenes, fluorocarbons, accrylates, etc. The insulating layer 112 can be formed by a coating method, such as a spin coating method, a spray coating method, or a curtain coating method, or other suitable deposition methods, such as a liquid phase deposition method, a physical vapor deposition (PVD) method, a chemical vapor deposition (CVD) method, a low pressure chemical vapor deposition (LPCVD) method, a plasma enhanced chemical vapor deposition (PECVD) method, a rapid thermal-CVD (RTCVD) method or an atmospheric pressure chemical vapor deposition (APCVD) method. The insulating layer 112 can isolate the semiconductor wafer 100' and a subsequently formed conductive trace layer 114.

Then, the conductive trace layer 114 is formed in the notches 109 and on the back side of the semiconductor wafer 100'. The conductive trace layer 114 can be formed by a physical vapor deposition (PVD) method or a sputtering method for conformally depositing a conductive layer, such as copper (Cu), aluminum (Al), silver (Ag), nickel (Ni) or alloys thereof, in the notches 109 and on the back side of the semiconductor wafer 100'. Then, the conductive layer is patterned by a photolithography and etching process to form the conductive trace layer 114. The conductive trace layer 114 is in contact with the surface of the conductive pad 102 to form an L-shaped contact and extends to a terminal contact (not shown) on the back side of the semiconductor wafer 100'.

Figure 4E:
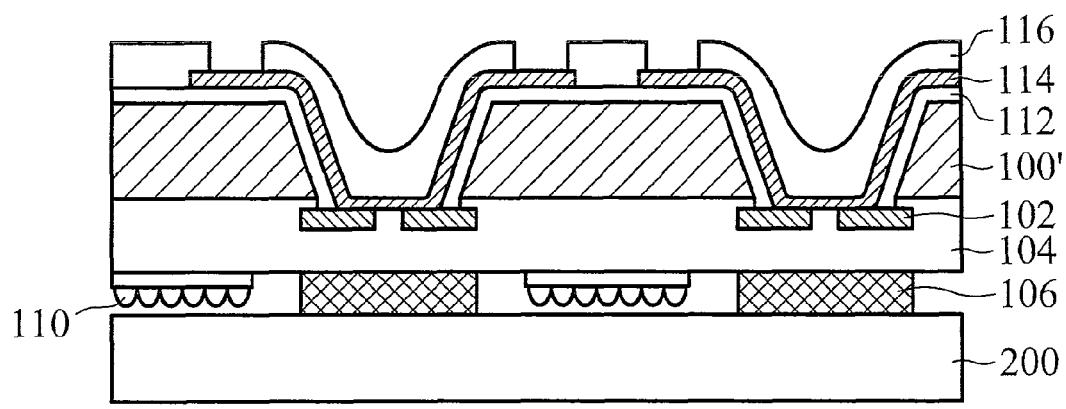
Figure 4F:
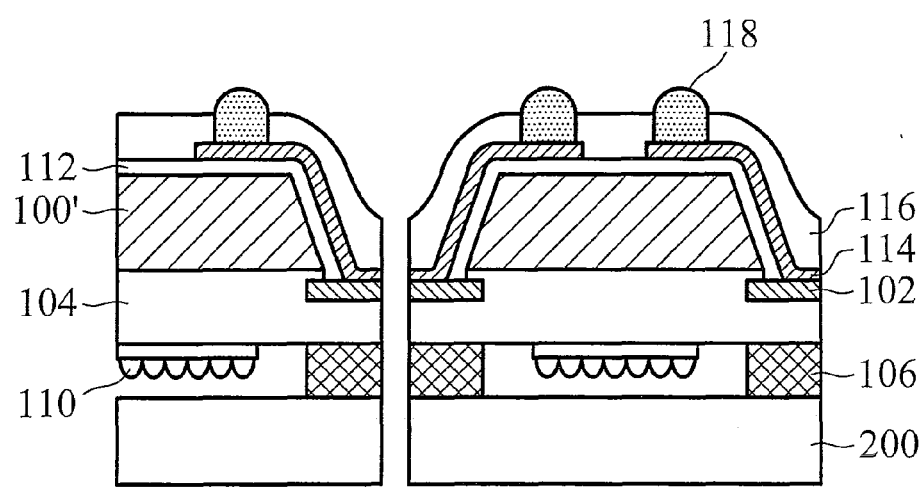

Next, referring to FIG. 4E, a passivation layer 116 is formed on the conductive trace layer 114, covering the back side of the semiconductor wafer 100' and the notches. The passivation layer 116 is for example a solder mask. Then, referring to FIG. 4F, a conductive bump 118 is formed, passing through the passivation layer 116 to electrically connect to the conductive trace layer 114. In an embodiment, after forming the passivation layer 116, the passivation layer 116 is patterned to form an opening, exposing a portion of the conductive trace layer 114. Then, the opening of the passivation layer 116 is filled with a solder by an electroplating method or a screen printing method and a re-flow process is performed to the solder to form the conductive bump 118, such as a solder ball or a solder paste. Next, a wafer level package of the chips is divided along the scribe line to separate each chip to complete the chip packaging process of an embodiment of the invention.

According to one embodiment of the invention, in the method of fabricating the chip package, the conductive pad 102 is not etched and only a contact surface of the conductive pad 102 is exposed to be in contact with the conductive trace layer 114 to form the L-shaped contact. Therefore, during the fabrication processes of the chip package, damage to the sealing ring formed from the conductive pads and the metal strips disposed between the conductive pads are prevented; thereby resulting in an effective sealing ring.

According to the above, embodiments of a sealing ring structure are provided. For example, in an embodiment, the sealing ring is formed from the conductive pads and the spaces between the two adjacent conductive pads. In an embodiment, the width of the sealing ring structure is not greater than the width of the conductive pad. In an embodiment, the sealing ring includes a plurality of metal strips, which are disposed apart from two adjacent conductive pads with at least an outside gap and at least an inside gap. A curved channel formed from the outside gap to the inside gap can reduce the stress placed on the chip packages.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
   a chip, having a plurality of conductive pads disposed along a periphery of the chip; and
   a ring structure, containing the plurality of conductive pads and at least two metal strips disposed within one space between any two adjacent conductive pads, top surfaces of the at least two metal strips and top surfaces of the any two adjacent conductive pads are co-planar, wherein at least one of the at least two metal strips, disposed between two adjacent conductive pads, extends from and directly contacts one of the two adjacent conductive pads, and is disposed apart from the other of the two adjacent conductive pads with a first gap, and wherein the two adjacent conductive pads are not electrically connected with each other by any of the at least two metal strips.

2. The chip package as claimed in claim 1, wherein the conductive pads have a width and the metal strips are disposed within the space between the two adjacent conductive pads and within the width, and the metal strips are parallel to each other.

3. The chip package as claimed in claim 2, wherein the metal strips are disposed apart from each other, such that a connection channel is surrounded by the metal strips, the any two adjacent conductive pads and the first gaps, and wherein the first gaps and the connection channel are arranged to form a curved channel, and a length of the curved channel is greater than a distance between an outside metal strip and an inside metal strip of the at least two metal strips.

4. The chip device package as claimed in claim 1, wherein the first gaps are staggered.

5. The chip package as claimed in claim 1, wherein the conductive pad comprises a plurality of metal layers.

6. The chip package as claimed in claim 5, further comprising a plurality of vias disposed between the metal layers of the conductive pad.

7. The chip package as claimed in claim 5, wherein the metal strip comprises a plurality of metal layers.

8. The chip package as claimed in claim 7, wherein the amount of the metal layers of the metal strip is the same as that of the metal layers of the conductive pad.

9. The chip package as claimed in claim 7, further comprising at least a stress barrier disposed between the metal layers of the metal strip.

10. The chip package as claimed in claim 7, wherein between each of the metal layers of each metal strip has a stress barrier.

11. The chip package as claimed in claim 1, wherein the plurality of conductive pads is disposed on a front side of the chip, and the chip package further comprises:

a packaging layer bonded to the front side of the chip and located on the plurality of conductive pads;

a conductive trace layer disposed on a back side of the chip opposite to the front side of the chip, wherein the conductive trace layer extends on a sidewall of the chip, and further extends to electrically connect the plurality of conductive pads;

a passivation layer disposed over the conductive trace layer, having an opening, exposing a portion of the conductive trace layer; and a conductive bump disposed on the opening, electrically connecting to the conductive trace layer.

12. A chip package, comprising:

a chip, having a plurality of conductive pads disposed along a periphery of the chip; and a ring structure, containing the plurality of conductive pads and at least two metal strips disposed within one space between any two adjacent conductive pads, top surfaces of the at least two metal strips and top surfaces of the any two adjacent conductive pads are co-planar, wherein at least one of the at least two metal strips, disposed between two adjacent conductive pads, extends from and directly contacts one of the two adjacent conductive pads, and is disposed apart from the other of the two adjacent conductive pads with a first gap, and wherein the two adjacent conductive pads are not electrically connected with each other by any of the at least two metal strips, the metal strips are parallel to each other and disposed apart from each other, such that a connection channel is surrounded by the metal strips, the any two adjacent conductive pads and the first gaps, the first gaps and the connection channel are arranged to form a curved channel, and a length of the curved channel is greater than a distance between an outside metal strip and an inside metal strip of the at least two metal strips.

13. The chip package as claimed in claim 12, further comprising a connection part extending from one of the conductive pads and located outside of the space between the any two adjacent conductive pads.

14. The chip package as claimed in claim 12, wherein the ring structure comprises more than two metal strips disposed within the space and parallel to each other.

15. The chip package as claimed in claim 1, further comprising a connection part extending from one of the conductive pads and located outside of the space between the any two adjacent conductive pads.

16. The chip package as claimed in claim 1, wherein the ring structure comprises more than two metal strips disposed within the space and parallel to each other.

\* \* \* \* \*